United States Patent [19]

Tamaki

[11] Patent Number: 5,523,174
[45] Date of Patent: Jun. 4, 1996

[54] PRINTED CIRCUIT BOARDS

[75] Inventor: Masanori Tamaki, Gifu, Japan

[73] Assignee: Ibiden Co., Ltd., Gifu, Japan

[21] Appl. No.: 419,747

[22] Filed: Apr. 10, 1995

Related U.S. Application Data

[63] Continuation of Ser. No. 235,966, May 2, 1994, abandoned.

[30] Foreign Application Priority Data

May 7, 1993 [JP] Japan .................................. 5-106407

[51] Int. Cl.$^6$ ...................................................... B32B 9/00
[52] U.S. Cl. .......................... 428/669; 428/671; 428/679; 428/643; 428/209; 428/901; 428/320.2; 428/323; 428/327; 427/436; 427/437; 427/438
[58] Field of Search ...................... 428/669, 671, 428/679, 643, 209, 901, 320.2, 323, 327; 427/436, 437, 438

[56] References Cited

U.S. PATENT DOCUMENTS

| | | | |
|---|---|---|---|
| 2,929,742 | 3/1960 | Minjer et al. | 427/438 |
| 3,046,159 | 7/1962 | Brookshire | 106/1.26 |
| 3,547,784 | 12/1970 | Bernhardt et al. | 428/411.1 |
| 3,832,168 | 8/1974 | Gulla | 428/680 |
| 4,167,416 | 9/1979 | Zolla | 427/438 |
| 4,265,943 | 5/1981 | Goldstein et al. | |
| 4,397,812 | 8/1983 | Mallory, Jr. | 420/441 |
| 4,482,596 | 11/1984 | Gulla et al. | 428/418 |
| 4,752,499 | 6/1988 | Enomoto | 427/98 |
| 4,777,078 | 10/1988 | Miyabayashi | 428/211 |
| 4,913,768 | 4/1990 | Wolf et al. | 156/645 |
| 5,021,472 | 6/1991 | Enomoto | 523/427 |
| 5,055,321 | 10/1991 | Enomoto et al. | 427/98 |
| 5,344,893 | 9/1994 | Asai et al. | 525/398 |

FOREIGN PATENT DOCUMENTS

| | | |
|---|---|---|
| 0324189 | 7/1989 | European Pat. Off. . |
| 57-501786 | 10/1982 | Japan . |
| 62-20878 | 1/1987 | Japan . |
| 63-44822 | 9/1988 | Japan . |
| 63-266076 | 11/1988 | Japan . |
| 82/01015 | 4/1982 | WIPO . |

OTHER PUBLICATIONS

Patent Abstracts of Japan, vol. 15, No. 90 (E–1040) Mar. 5, 1991.

*Primary Examiner*—Patrick J. Ryan
*Assistant Examiner*—Kam F. Lee
*Attorney, Agent, or Firm*—Greenblum & Bernstein

[57] ABSTRACT

Printed circuit board having excellent peel strength and conductance resistance is provided with a substrate, a resin insulating layer formed thereon and roughened at its surface, and a conductor formed thereon, in which at least a portion of the conductor is composed of an eutectic metal layer.

9 Claims, 1 Drawing Sheet

FIG_1
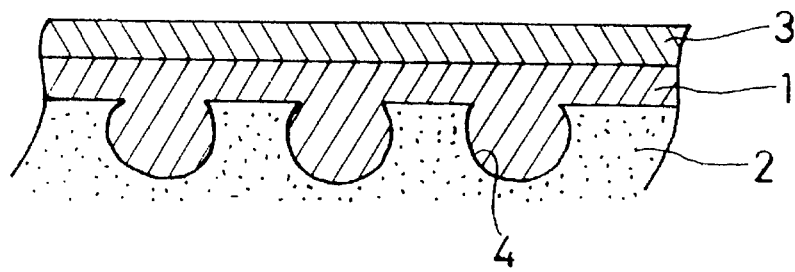
FIG_2
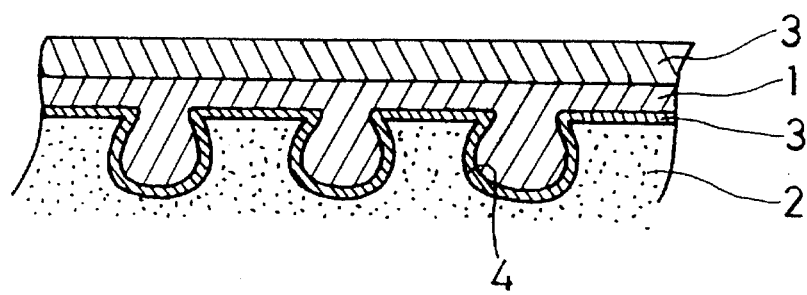
FIG_3
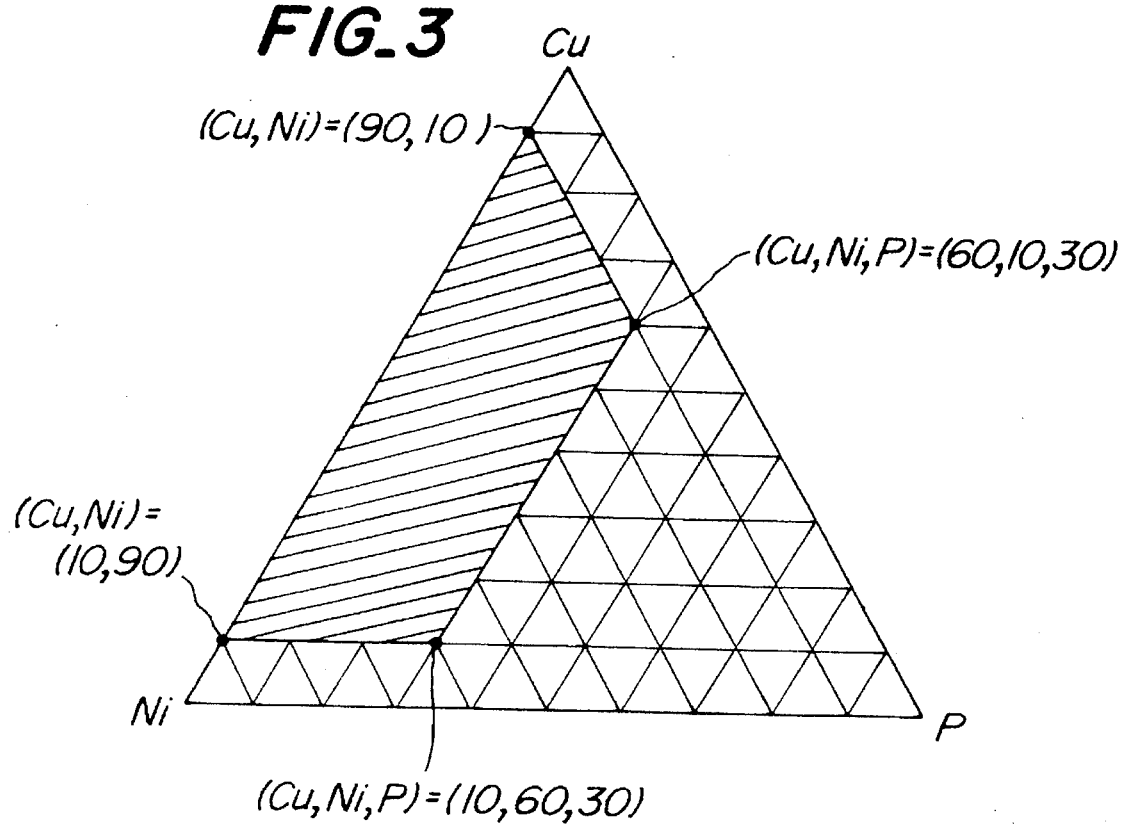

PRINTED CIRCUIT BOARDS

This application is a continuation of application No. 08/235,966, filed May 2, 1994, now abandoned.

BACKGROUND OF THE INVENTION

1. Field of the Invention

This invention relates to a printed circuit board, and more particularly to a printed circuit board having excellent adhesion property between conductor formed through an additive process and resin insulating layer and conductance resistance.

2. Description of the Related Art

Recently, there has been increased miniaturization and high-speed performance of electronic equipment with the progress in the electronics industry, and consequently it is necessary to have high densification and reliability through fine pattern against printed circuit board and printed wiring substrate mounting LSI.

Lately, an additive process in which an adhesive is applied onto a surface of a substrate to form a resin insulating layer, and the surface of the resin insulating layer is roughened and then subjected to an electroless plating to form a conductor is noticed as another method of forming the conductor onto the printed wiring substrate.

According to this method, the conductor is formed by electroless plating after the formation of the resist, so that it has a merit that conductor wiring having high density and pattern accuracy can be produced with a low cost as compared with an etched foil process conducting the formation of the pattern through etching (which is known as a subtractive process).

In the additive process, there have hitherto been known a method in which fine unevenness is formed on the surface side of the resin insulating layer for the formation of the conductor through chemical etching as a means for improving the adhesion property between conductor and resin insulating layer (hereinafter referred to as peel strength). According to this method, the unevenness of the surface of the resin insulating layer is subjected to a metal plating, such as copper plating, whereby the peel strength can be improved through an anchor effect based on the unevenness. Such an improvement of the peel strength through the anchor effect is generally carried out by enlarging the braking surface or by increasing the strength of the conductor metal or the resin insulating layer.

In recent additive type printed circuit boards requiring the formation of wiring with high density and pattern accuracy, it is required to make small anchors formed by surface roughening of the resin insulating layer in order to precisely form the fine pattern of the resist. Therefore, this conventional technique causes a problem that, as the anchor becomes small, the breaking area is also small, and hence the peel strength considerably lowered.

In order to solve this problem, there is a method of increasing the strength of the resin, but the breakage of the conductor metal portion becomes a problem.

When the modulus of elasticity and yield point of the conductor metal are low, the metal filled in the anchor is plastically deformed through a very small external force to be removed from the anchor, and the conductor is peeled off from the resin insulating layer.

Further, when the tensile strength of the conductor metal is low, the metal filled in the anchor is broken by a very small external force, and the conductor is peeled off from the resin insulating layer.

Particularly, the above phenomenon is conspicuous in copper, which has a generally low modulus of elasticity and yield point or tensile strength.

SUMMARY OF THE INVENTION

It is, therefore, an object of the present invention to solve the above-noted problems of conventional techniques and to provide a printed circuit board having excellent peel strength and conductance resistance in higher density and pattern accuracy wirings by improving the strength of the conductor metal while maintaining the conductance resistance at a low level.

The inventor has made various studies with respect to the improvement of the strength in the conductor metal in order to achieve the above-noted object and has found that it is effective to improve the peel strength when at least a part of the metal filled into the anchor recesses of the roughened surface is an eutectic metal, and as a result the invention has been achieved.

According to the invention, there is the provision of a printed circuit board comprising a printed wiring substrate, a resin insulating layer formed thereon and provided with a roughened surface, and a conductor circuit formed thereon, in which at least a portion of the conductor is constituted by an eutectic metal. In a preferred embodiment of the invention, at least a portion of the conductor facing the roughened surface side of the resin insulating layer inclusive of the anchor recess is constituted by the eutectic metal, or is constituted with a single metal layer formed along the roughened surface and an eutectic metal layer formed at a state of filling the eutectic metal therein.

Moreover, the single metal layer has a layer thickness of not less than 0.05 μm and the ratio thereof occupied in the anchor recess is not more than 50 vol %. The eutectic metal is preferably an eutectic mixture of at least two of Ni, Co, Cu, Au and Ag, or an eutectic mixture of at least one of Ni, Co, Cu, Au and Ag and at least one of Sn, Pb, B, P, C and a transition metal.

In the invention, the eutectic metal means a state of soluting a different metal into main metal ingredient, a state of dispersing a different metal into main metal ingredient or a state of existing a different metal in grain boundary of main metal ingredient.

In general, plastic deformation is caused in a metal through the movement of metal atoms. It is known that when a solid solution of another metal or the like is existent around the metal atoms, the movement of the atoms becomes difficult, and hence plastic deformation is suppressed to improve the strength of the metal.

The invention is based on the above knowledge and found out that the same effect of controlling the plastic deformation as mentioned above is developed by using a so-called eutectic metal, so that a different metal is soluted or diffused into a main metal ingredient or the different metal is existent in a grain boundary of the main metal ingredient as a metal filled in the anchor.

An essential feature of the printed circuit board according to the invention lies in that at least a part of conductor metal filled in the anchor recess is constituted with an eutectic metal. Thus, the invention can provide a printed circuit board having excellent peel strength and conductance resistance even in wiring having higher density and pattern accuracy.

BRIEF DESCRIPTION OF THE DRAWINGS

The invention will be described with reference to the accompanying drawings, wherein:

FIG. 1 is a diagrammatically sectional view of an embodiment illustrating the structure of the conductor and resin insulating layers in the printed circuit board according to the invention;

FIG. 2 is a diagrammatically sectional view of another embodiment illustrating the structure of conductor and resin insulating layers in the printed circuit board according to the invention; and FIG. 3 is a triangular diagram showing a composition of eutectic metal precipitated by Cu-Ni-P eutectic plating.

DESCRIPTION OF THE PREFERRED EMBODIMENTS

In the invention, at least a part of the metal constituting the conductor of the printed circuit board is composed of an eutectic metal. As shown in FIG. 1, for instance, at least a portion of the conductor facing to the roughened surface side of a resin insulating layer 2, inclusive of the anchor recess 4, is constituted with an eutectic metal layer 1, and the other portion thereof may be constituted with an ordinary single metal layer 3. Alternatively, as shown in FIG. 2, at least a portion of the conductor facing to the roughened surface side of the resin insulating layer 2 inclusive of the anchor recess 4 may be constituted with a single metal layer 3 formed along the roughened surface and an eutectic metal layer 1 formed thereon at a state that eutectic metal is at least filled in the anchor recess 4. In case of the structure shown in FIG. 2, the single metal layer formed along the roughened surface is required to have a thickness of not less than 0.05 μm for forming a lead for electrolytic plating, and also it is necessary that the ratio of the single metal layer occupied in the anchor recess is 50 vol % for improving the strength of the conductor metal.

In the invention, the metal constituting the conductor of the printed circuit board is enough to be a combination of metals constituting the eutectic metal. Particularly, at least one of Ni, Co, Cu, Au and Ag is an essential ingredient from a viewpoint of maintaining the conductance resistance at a low level.

The printed circuit board according to the invention is required to be subjected to wiring with higher density and pattern accuracy, so that it is preferable that the conductor metal may be subjected to electrolytic plating or electroless plating. As a result, Ni, Co, Cu, Au and Ag, as well as Sn, Pb, B, P, C and transition metal are used as the conductor metal.

Especially, Cu-Ni-P eutectic plating is excellent in the strength and conductance resistance and is favorable because abnormal precipitation is less in the plating bath and stability of the plating bath is excellent.

As a source for Cu, use may be made of any water-soluble Cu sources, among which $CuSO_4$, $CuCl_2$, copper sulfate and $Cu(NO_3)_2$ are preferable. As a source for Ni, use may be made of any water-soluble Ni sources, among which $NiSO_4$, $NiCl_2$, nickel acetate and $Ni(NO_3)_2$ are preferable.

According to the invention, the above Cu-Ni-P eutectic plating is preferable to be conducted under the following bath conditions:

(Cu+Ni) concentration: 0.05–0.25 mol/l of solution
Cu/(Cu+Ni): 0.01–0.5
sodium dihydrogen citrate: 0.05–1 mol/l of solution
$NaPH_2O_2$: 0.05–1 mol/l of solution
pH: 7–12
$PEG_{1000}$: 0–0.5 g/l
bath temperature: 50°–90° C.
stirring: air stirring+mechanical stirring The composition of Cu-Ni-P eutectic metal precipitated under the above conditions is within a shadowed range shown in FIG. 3. The Cu-Ni-P eutectic metal layer existing in the above range exhibits excellent strength and conductance resistance. That is, when the composition is outside this range, either one of strength and conductance resistance is deteriorated.

Since the adhesive layer constituting the resin insulating layer of the printed circuit board according to the invention can uniformly be roughened and effectively form anchor recesses, it is preferable to use an adhesive formed by dispersing heat-resistant resin powder soluble in an oxidizing agent and previously subjected to a curing treatment into an uncured heat-resistant resin solution exhibiting insolubility to the oxidizing agent after the curing treatment.

The heat-resistant resin powder is desirable to have an average particle size of not more than 10 μm. Further, in order to obtain a fine pattern of not more than L/S=50/50 (μm), the depth of the anchor recess formed in the resin insulating layer is required to be not more than 15 μm. Particularly, such a shallow anchor is effective if it is intended to obtain a high peel strength in the eutectic plating according to the invention.

A method of producing the printed circuit board according to the invention will be described below.

At first, an adhesive layer is formed on a surface of a substrate 5, such as a glass epoxy substrate, a polyimide substrate, ceramic substrate, metal substrate or the like in the usual manner, and then roughened at its surface with an acid or an oxidizing agent in the usual manner. Thereafter a catalyst is applied and fixed to the roughened surface of the adhesive layer.

After the catalyst is activated by an acid treatment, the roughened surface side of the adhesive layer, at least including the anchor recess, is subjected to an electroless eutectic plating, and, if necessary, to a usual plating to form a conductor pattern, whereby a desired printed circuit board is obtained.

The conductor circuit in the above production method of the printed circuit board can be formed by various methods used in the conventionally known printed circuit boards. For example, there can be adopted a method in which the conductor circuit is formed by plating after the formation of plating resist printed into a given pattern, a method in which the substrate is subjected to an electroless plating to form a circuit through etching, a method in which the circuit is directly formed in the electroless plating, and the like.

Moreover, the formation of the conductor made from the eutectic metal is not limited to electroless plating or electrolytic plating, and may be conducted by various methods such as vapor deposition and the like.

In the invention, the single metal layer is formed by plating or the like at a thickness of not less than 0.05 μm along the roughened surface of the resin insulating layer formed on the substrate so as to occupy not more than 50 vol % of the anchor recess, and the eutectic metal layer is formed thereon by eutectic plating and, is necessary, the usual plating is conducted, whereby the conductor pattern can be formed.

The following examples are given in illustration of the invention and are not intended as limitations thereof.

EXAMPLE 1

(1) 70 parts by weight of 50% acrylated product of cresol-novolac type epoxy resin (made by Nippon Kayaku Co., Ltd.) and 30 parts by weight of bisphenol A-type epoxy resin (made by Yuka Shell Co., Ltd.) are mixed with 7.5 parts by weight of dipentaerythritol hexaacrylate (made by Kyoeisha Yushi Co., Ltd.) and 3.75 parts by weight of neopentylglycol-modified trimethylol propane diacrylate (made by Nippon Kayaku Co., Ltd.) as a photosensitive monomer, 5 parts by weight of benzophenone and 0.5 part by weight of Michlar's ketone as a photopolymerization initiator, 4 parts by weight of imidazole type curing agent (made by Shikoku Kasei Co., Ltd.), 25 parts by weight of epoxy resin filler (made by Toray Co., Ltd.) having a particle size of 5.5 μm and 10 parts by weight of epoxy resin filler (made by Toray Co., Ltd.) having a particle size of 0.5 μm, which are stirred in a homodisper agitating machine while adding butylcellosolve acetate. Furthermore, the resulting mixture is added with 0.9 wt % of an anti-foaming agent (made by Sannopuco Co., Ltd.) and kneaded through three rolls to obtain an adhesive having a solid content of 70%.

(2) The resulting adhesive of the above item (1) is applied onto an insulative substrate of 1.6 mm in thickness not adhered with a copper foil by means of a roll coater three times, and dried at 80° C. for 1 hour, at 100° C. for 1 hour, at 120° C. for 1 hour and at 150° C. for 3 hours to obtain an adhesive layer having a thickness of 70 μm.

(3) The substrate provided with the adhesive layer is immersed in an oxidizing agent made from an aqueous solution of 500 g/l of chromic acid at 70° C. for 15 minutes to roughen the surface of the adhesive layer (average depth of anchor recess: 10 μm), which is immersed in a neutral solution (made by Shipley Co., Ltd.) and washed with water. The surface roughness of the adhesive layer is 10 μm on average.

(4) A palladium catalyst (made by Shipley Co., Ltd.) is applied to the substrate with the roughened adhesive layer.

(5) A liquid photoresist is applied onto the roughened surface provided with the catalyst.

(6) A conductor pattern is formed by a usual photographic technique.

(7) After the catalyst is activated by an acid treatment, the substrate is subjected to an electroless Cu-Ni-P eutectic plating at a plated thickness of 2 μm by immersing in an electroless eutectic plating solution having a composition as shown in Table 1 for 1 hour.

TABLE 1

| | |
|---|---|
| Nickel sulfate | 0.095 mol/l |
| Copper sulfate | 0.005 mol/l |
| Sodium dihydrogen citrate | 42.82 g/l |
| Sodium phosphinate | 21.20 g/l |
| Plating temperature | 60° C. |
| pH | 10 |

(8) Then, the substrate is subjected to an electroless copper plating at a plated thickness of 25 μm by immersing in an electroless copper plating solution having a composition as shown in Table 2 for 12 hours.

TABLE 2

| | |
|---|---|
| Copper sulfate | 0.06 mol/l |
| Formalin (37%) | 0.30 mol/l |
| Sodium hydroxide | 0.35 mol/l |

TABLE 2-continued

| | |
|---|---|
| EDTA | 0.35 mol/l |
| Additive | slight |
| Plating temperature | 70–72° C. |
| pH | 12.4 |

(9) An adhesion strength (peel strength) between the adhesive layer and the plated layer in the plated layers formed in the items (7) and (8) is measured by means of an autograph. As a result, the peel strength is 1.42 kg/cm as shown in Table 12. Moreover, the composition of the electroless Cu-Ni-P eutectic plated layer is Cu: 20%, Ni: 60% and P: 20% by EPMA analysis.

EXAMPLE 2

(1) 70 parts by weight of cresol-novolac type epoxy resin (made by Nippon Kayaku Co., Ltd.) is mixed with 30 parts by weight of polyethersulfon (PES, made by Yuka Shell Co., Ltd.), 5 parts by weight of an imidazole type curing agent (made by Shikoku Kasei Co., Ltd.), 20 parts by weight of epoxy resin filler (made by Toray Co., Ltd.) having a particle size of 5.5 μm and 10 parts by weight of epoxy resin filler (made by Toray Co., Ltd.) having a particle size of 0.5 μm, which are adjusted to a viscosity of 120 cps in a homodisper agitating machine while adding a mixed solvent of dimethylformamide /butylcellosolve (½) and kneaded through three rolls to obtain an adhesive.

(2) The adhesive of the item (1) is applied to a glass epoxy insulative substrate not adhered with a copper foil (made by Toshiba Chemical Co., Ltd.) by means of a roll coater (made by Thermatronics Co., Ltd.) and dried at 80° C. for 2 hours, at 120° C. for 1 hour and at 150° C. for 4 hours to obtain an adhesive layer having a thickness of 70 μm.

(3) The substrate provided with the adhesive layer is immersed in an oxidizing agent made from an aqueous solution of 500 g/l of chromic acid at 70° C. for 15 minutes to roughen the surface of the adhesive layer, immersed in a neutral solution (made by Shipley Co., Ltd.) and washed with water. The surface roughness of the adhesive layer is 10 μm on average.

(4) The same procedure as in the items (4)–(9) of Example 1 is repeated and as a result, the peel strength is 2.53 kg/cm as shown in Table 12.

EXAMPLE 3

The same procedure as in Example 2 is repeated except that the substrate is subjected to an electroless Co-W-P eutectic plating at a plated thickness of 2 μm by immersing in an electroless eutectic plating solution having a composition as shown in Table 3 for 1 hour, and then the adhesion strength is measured. As a result, the peel strength is 2.3 kg/cm as shown in Table 12.

TABLE 3

| | |
|---|---|
| Cobalt sulfate | 0.05 mol/l |
| Sodium tungustate | 0–0.18 mol/l |
| Sodium citrate | 0.1–0.5 mol/l |
| Ammonium sulfate | 0.5 mol/l |
| Sodium phosphite | 0.5 mol/l |
| Plating temperature | 70° C. |
| pH | 10 |

EXAMPLE 4

The peel strength is measured in the same manner as in Example 2 except for the formation of the conductor as mentioned below.

A Pd catalyst (made by Shipley Co., Ltd.) is applied onto full surface of the substrate provided with the roughened adhesive layer and activated by an acid treatment, and thereafter the substrate is subjected to an electrolytic Cu-Ni eutectic plating at a plated thickness of 2 μm by immersing in an electrolytic plating solution having a composition as shown in Table 4 for 15 minutes. Then, the substrate is subjected to an electroless Cu plating at a plated thickness of 25 μm by immersing in an electroless Cu plating solution having a composition shown in Table 4 for 12 hours. A liquid photoresist is applied onto the electroless Cu plated layer and rendered into an etching resist by the usual photographic technique. After the formation of the etching resist, it is immersed in an etching solution to form a conductor pattern. As a result, the peel strength is 1.7 kg/cm as shown in Table 12. Moreover, the composition of the electrolytic Cu-Ni eutectic plated layer is Cu: 45% and Ni: 55% by EPMA analysis.

TABLE 4

| | |
|---|---|
| Nickel chloride | 0.05 mol/l |
| Copper pyrophosphate | 0–0.18 mol/l |
| Potassium pyrophosphate | 0.1–0.5 mol/l |
| Plating temperature | 60° C. |
| Current density | 2 A/dm$^2$ |

EXAMPLE 5

The adhesion strength is measured in the same manner as in Example 4 except that the substrate is subjected to an electrolytic Cu-Co-Ni eutectic plating at a plated thickness of 2 μm by immersing in an electrolytic eutectic plating solution having a composition as shown in Table 5 for 10 minutes. As a result, the peel strength is 1.8 kg/cm as shown in Table 12.

TABLE 5

| | |
|---|---|
| NiSO$_4$ | 80 g/l |
| CoSO$_4$ | 5 g/l |
| CuSO$_4$ | 1 g/l |
| Citric acid | 12 g/l |
| Ammonium chloride | 2 g/l |
| Plating temperature | 40° C. |
| pH | 4.0 |
| Current density | 2 A/dm$^2$ |

EXAMPLE 6

The adhesion strength is measured in the same manner as in Example 2 except that the substrate is subjected to an electroless Cu-Ni-B eutectic plating at a plated thickness of 2 μm by immersing in an electroless eutectic plating solution having a composition as shown in Table 6 for 1 hour. As a result, the peel strength is 2.4 kg/cm as shown in Table 12.

TABLE 6

| | |
|---|---|
| Nickel sulfate | 0.08 mol/l |
| Copper sulfate | 0.02 mol/l |
| Sodium dihydrogen citrate | 50 g/l |
| Sodium boron hydride | 30 g/l |
| Plating temperature | 70° C. |

TABLE 6-continued

| | |
|---|---|
| pH | 10 |

EXAMPLE 7

The adhesion strength is measured in the same manner as in Example 2 except that the substrate is subjected to an electroless Cu-Ni-B-C eutectic plating at a plated thickness of 2 μm by immersing in an electroless eutectic plating solution having a composition as shown in Table 7 for 1 hour. As a result, the peel strength is 2.2 kg/cm as shown in Table 12.

TABLE 7

| | |
|---|---|
| Nickel sulfate | 0.08 mol/l |
| Copper sulfate | 0.02 mol/l |
| Fe$_2$(C$_2$O$_4$)$_3$ | 10 g/l |
| Sodium dihydrogen citrate | 50 g/l |
| Sodium hydrogen hydride | 30 g/l |
| Plating temperature | 70° C. |
| pH | 10 |

EXAMPLE 8

The adhesion strength is measured in the same manner as in Example 4 except that the substrate is subjected to an electrolytic Ag-Sn eutectic plating at a plated thickness of 2 μm by immersing in an electrolytic eutectic plating solution having a composition as shown in Table 8 for 15 minutes. As a result, the peel strength is 1.7 kg/cm as shown in Table 12.

TABLE 8

| | |
|---|---|
| Potassium silver cyanide | 18.5 g/l |
| Tin pyrophosphate | 51.8 g/l |
| Potassium pyrophosphate | 231 g/l |
| pH | 9.0 |
| Current density | 1 A/dm$^2$ |

EXAMPLE 9

The adhesion strength is measured in the same manner as in Example 4 except that the substrate is subjected to an electrolytic Au-Pb eutectic plating at a plated thickness of 2 μm by immersing in an electrolytic eutectic plating solution having a composition as shown in Table 9 for 15 minutes. As a result, the peel strength is 1.7 kg/cm as shown in Table 12.

TABLE 9

| | |
|---|---|
| Potassium gold cyanide | 19 g/l |
| Lead pyrophosphate | 60 g/l |
| Potassium pyrophosphate | 250 g/l |
| pH | 9.0 |
| Current density | 1 A/dm$^2$ |

EXAMPLE 10

The adhesion strength is measured in the same manner as in Example 4 except that the substrate is subjected to an electrolytic Au-Ag eutectic plating at a plated thickness of 2 μm by immersing in an electrolytic eutectic plating solution having a composition as shown in Table 10 for 15 minutes. As a result, the peel strength is 1.68 kg/cm as shown in Table 12.

TABLE 10

| | |
|---|---|
| Potassium gold cyanide | 20 g/l |
| Potassium silver cyanide | 18 g/l |
| Potassium pyrophosphate | 250 g/l |
| pH | 9.0 |
| Current density | 1 A/dm² |

COMPARATIVE EXAMPLE 1

The same procedure as in Example 1 is repeated except that the step of the item (7) is omitted and then the peel strength is measured. As a result, the peel strength is 0.8 kg/cm as shown in Table 12.

COMPARATIVE EXAMPLE 2

The peel strength is measured in the same manner as in Comparative Example 1 except that the surface roughness is 20 μm and the anchor recess is made deep. As a result, the peel strength is 1.8 kg/cm as shown in Table 12. However, the fine pitch conductor of L/S=50/50 (μm) can not be formed because the surface roughness is made large.

COMPARATIVE EXAMPLE 3

The adhesion strength is measured in the same manner as in Example 4 except for the use of an electrolytic eutectic plating solution having a composition as shown in Table 11. As a result, the peel strength is 1.2 kg/cm as shown in Table 12.

TABLE 11

| | |
|---|---|
| NiSO₄ | 240 g/l |
| Boric acid | 30 g/l |
| pH | 5 |
| Plating temperature | 50° C. |
| Current density | 2 A/dm² |

TABLE 12

| | | Composition of metals precipitated by plating | Peel strength (kg/cm) | Peel strength per anchor depth (kg·cm⁻¹/μm) | specific resistance (×10⁻⁶ Ω·cm) | Formability of L/S = 50/50 (μm) |
|---|---|---|---|---|---|---|
| Example | 1 | Cu:20%, Ni:60%, P:20% | 1.42 | 0.142 | 5.0 | ○ |
| | 2 | Cu:20%, Ni:60%, P:20% | 2.53 | 0.253 | 5.0 | ○ |
| | 3 | Co:70%, W:10%, P:20% | 2.3 | 0.23 | 6.0 | ○ |
| | 4 | Cu:45%, Ni:55% | 1.7 | 0.17 | 3.0 | ○ |
| | 5 | Ni:50%, Co:30%, Cu:20% | 1.8 | 0.18 | 2.8 | ○ |
| | 6 | Ni:50%, Cu:30%, P:20% | 2.4 | 0.24 | 4.0 | ○ |
| | 7 | Ni:50%, Cu:30%, P:17% C:3% | 2.2 | 0.22 | 4.0 | ○ |
| | 8 | Ag:60%, Sn:40% | 1.7 | 0.17 | 2.0 | ○ |
| | 9 | Au:40%, Pb:60% | 1.7 | 0.17 | 2.1 | ○ |
| | 10 | Au:50%, As:50% | 1.68 | 0.168 | 2.0 | ○ |
| Comparative example | 1 | Cu:100% | 0.8 | 0.08 | 4.0 | ○ |
| | 2 | Cu:100% | 1.8 | 0.09 | 4.0 | X |
| | 3 | Ni:100% | 1.2 | 0.12 | 10.0 | ○ |

As seen from the results of Table 12, the printed circuit boards according to the invention are excellent in the peel strength per anchor depth, specific resistance and formability of L/S=50/50 (μm).

Moreover, the test method and evaluation method for the peel strength, specific resistance and formability of L/S=50/50 (μm) are as follows.

(1) Peel strength

It is measured according to JIS-C-6481.

Moreover, the peel strength per anchor depth is evaluated by using the specimen having an average anchor depth of 10 μm.

(2) Specific resistance

The specific resistance ρ means a reciprocal number of electrical conductance.

The sectional area S, and resistance R in a portion of length l are measured by lout-terminal method and the specific resistance p is calculated from R=(l/S)ρ.

(3) Formability of L/S=50/50 (μm)

After a comb-type pattern for the measurement of insulation resistance of L/S=50/50 (μm) is formed on a resist of 40 μmt, it is evaluated by the presence or absence of development residue and pattern scatter.

○: absence

X : presence

As mentioned above, according to the invention, there can be provided printed circuit boards having excellent peel strength and conductance resistance even in wiring with higher density and pattern accuracy.

What is claimed is:

1. A printed circuit board, comprising:

a substrate;

a resin insulating layer comprising a roughened surface on said substrate, said resin insulating layer comprising an adhesive layer formed by dispersing heat-resistant resin powder having a particle size of not greater than 10 μm and soluble in an oxidizing agent into a heat resistant-resin which is hardly soluble in the oxidizing agent, said roughened surface comprising anchor recesses formed by dissolving said heat-resistant resin powder in the oxidizing agent; and a conductor circuit on said resin insulating layer, a portion of a conductor in said conductor circuit at least facing said roughened surface inclusive of said anchor recess is composed of an eutectic metal.

2. The printed circuit board according to claim 1, wherein said eutectic metal comprises an eutectic mixture of at least two metals selected from the group consisting of Ni, Co, Cu, Au and Ag.

3. The printed circuit board according to claim 1, wherein said eutectic metal comprises an eutectic mixture of at least one metal selected from the group consisting of Ni, Co, Cu, Au and Ag, and at least one metal selected from the group consisting of Sn, Pb, B, P, C and a transition metal.

4. A printed circuit board, comprising:

a substrate;

a resin insulating layer comprising a roughened surface on said substrate, said resin insulating layer comprising an adhesive layer formed by dispersing heat-resistant resin powder having a particle size of not greater than 10 μm and soluble in an oxidizing agent into a heat resistant-resin which is hardly soluble in the oxidizing agent, said roughened surface comprising anchor recesses formed by dissolving said heat-resistant resin powder in the oxidizing agent; and a conductor circuit formed on said resin insulating layer, a portion of a conductor in said conductor circuit at least facing said roughened surface inclusive of said anchor recesses comprising a single metal layer formed along said roughened surface, an eutectic metal layer on said single metal layer, and said eutectic metal layer filling said anchor recesses.

5. The printed circuit board according to claim 4, wherein said eutectic metal comprises an eutectic mixture of at least two metals selected from the group consisting of Ni, Co, Cu, Au and Ag.

6. The printed circuit board according to claim 4, wherein said eutectic metal comprises an eutectic mixture of at least one metal selected from the group consisting of Ni, Co, Cu, Au and Ag, and at least one metal selected from the group consisting of Sn, Pb, B, P, C and a transition metal.

7. The printed circuit board according to claim 4, wherein said single metal layer comprises a thickness of not less than 0.05 μm and a ratio thereof occupied in each anchor recess of not more than 50 vol %.

8. The printed circuit board according to claim 7, wherein said eutectic metal comprises an eutectic mixture of at least two metals selected from the group consisting of Ni, Co, Cu, Au and Ag.

9. The printed circuit board according to claim 7, wherein said eutectic metal comprises an eutectic mixture of at least one metal selected from the group consisting of Ni, Co, Cu, Au and Ag, and at least one metal selected from the group consisting of Sn, Pb, B, P, C and a transition metal.

* * * * *